United States Patent [19]
Wakamiya et al.

[11] Patent Number: 5,521,419
[45] Date of Patent: *May 28, 1996

[54] SEMICONDUCTOR DEVICE HAVING FIELD SHIELD ELEMENT ISOLATING STRUCTURE AND METHOD OF MANUFACTURING THE SAME

[75] Inventors: Wataru Wakamiya; Shinichi Satoh; Hiroji Ozaki; Takahisa Eimori; Yoshinori Tanaka, all of Hyogo, Japan

[73] Assignee: Mitsubishi Denki Kabushiki Kaisha, Tokyo, Japan

[*] Notice: The term of this patent shall not extend beyond the expiration date of Pat. No. 4,998,161.

[21] Appl. No.: 327,341

[22] Filed: Oct. 21, 1994

Related U.S. Application Data

[63] Continuation of Ser. No. 71,022, Jun. 3, 1993, abandoned, which is a continuation of Ser. No. 436,998, Nov. 15, 1989, abandoned.

[30] Foreign Application Priority Data

Feb. 10, 1989 [JP] Japan ..................... 1-32101

[51] Int. Cl.[6] ................................. H01L 29/76
[52] U.S. Cl. .................. 257/394; 257/296; 257/488; 257/508
[58] Field of Search .................. 357/53, 23.6, 23.11; 257/296, 305, 394, 395, 488, 508, 630

[56] References Cited

U.S. PATENT DOCUMENTS

| | | | |
|---|---|---|---|
| 4,561,170 | 12/1985 | Doering et al. | |
| 4,825,278 | 4/1989 | Hillenius et al. | 357/23.11 |
| 4,900,693 | 2/1990 | Manning | 257/488 |
| 4,954,871 | 9/1990 | Mizutani et al. | 257/369 |
| 4,975,753 | 12/1990 | Ema | 357/23.6 |
| 4,994,893 | 2/1991 | Ozaki et al. | 357/53 |
| 4,998,161 | 3/1991 | Kimura et al. | 257/630 |
| 5,014,099 | 5/1991 | McElroy | 357/53 |
| 5,016,069 | 5/1991 | Bergemont | 357/23.11 |
| 5,067,000 | 11/1991 | Eimori et al. | 257/508 |
| 5,164,803 | 11/1992 | Ozaki et al. | 257/394 |
| 5,181,094 | 1/1993 | Eimori et al. | 257/394 |
| 5,225,704 | 7/1993 | Wakamiya et al. | 257/488 |

FOREIGN PATENT DOCUMENTS

| | | | |
|---|---|---|---|
| 3540422A1 | 12/1985 | Germany . | |
| 3842749A1 | 7/1989 | Germany . | |
| 51-32459 | 9/1976 | Japan . | |
| 57-25985 | 6/1982 | Japan . | |
| 57-201048 | 12/1982 | Japan | 357/53 |
| 62-122174 | 6/1987 | Japan . | |
| 62-122174 | 6/1987 | Japan . | |
| 62-162353 | 7/1987 | Japan . | |

OTHER PUBLICATIONS

"A High–Performance Directly Insertable Self–Aligned Ultra–Radiation–Hard and Enhanced Isolation Field–Oxide Technology for Gigahertz Si–CMOS VLSI" Lalita Machanda et al., published in IEEE Electron Device Letters, vol. 10, No. 1, p. 17, Jan. 1989.

Lin et al., "Shielded Silicon Gate Complementary MOS Integrated Circuit," IEEE Transactions on Electron Devices, vol. 19, No. 11, Nov. 1972, pp. 1199–1206.

*Primary Examiner*—Sara W. Crane
*Assistant Examiner*—Courtney A. Bowers
*Attorney, Agent, or Firm*—Lowe, Price, LeBlanc & Becker

[57] ABSTRACT

A field shield isolating structure forms a structure for isolating elements of a semiconductor device. The field shield isolating structure includes a field shield gate insulating film and field shield electrode formed on the semiconductor substrate in separate processes to constitute a quasi-MOS transistor using impurity regions of adjacent MOS transistors. The film thickness of the field shield gate insulating film is set arbitrarily, the threshold voltage of the quasi-MOS transistor is set high, and then elements are insulated and isolated, so that the transistor is operated in the off state. The upper surface of the field shield electrode is also covered with the upper insulating film. The thicknesses of the upper insulating film and of the field shield gate insulating film is adjusted to have such values that prevent turning ON of the MOS transistor by the capacitance divided voltage. The voltage may be applied from upper conductive layers such as word lines formed above the upper insulating film.

10 Claims, 6 Drawing Sheets

SEMICONDUCTOR DEVICE HAVING FIELD SHIELD ELEMENT ISOLATING STRUCTURE AND METHOD OF MANUFACTURING THE SAME

This is a continuation of application Ser. No. 08/071,022 filed Jun. 3, 1993, now abandoned, which is a continuation of Application Ser. No. 07/436,998 filed Nov. 15, 1989, now abandoned.

BACKGROUND OF THE INVENTION

1. Field of the Invention

The present invention relates to a semiconductor device and, more particularly, to the improvement of an element isolating structure of a semiconductor device having a so-called filed shield isolating structure and the improvement of a method of manufacturing the field shield isolating structure.

2. Description of the Background Art

Figure 3:
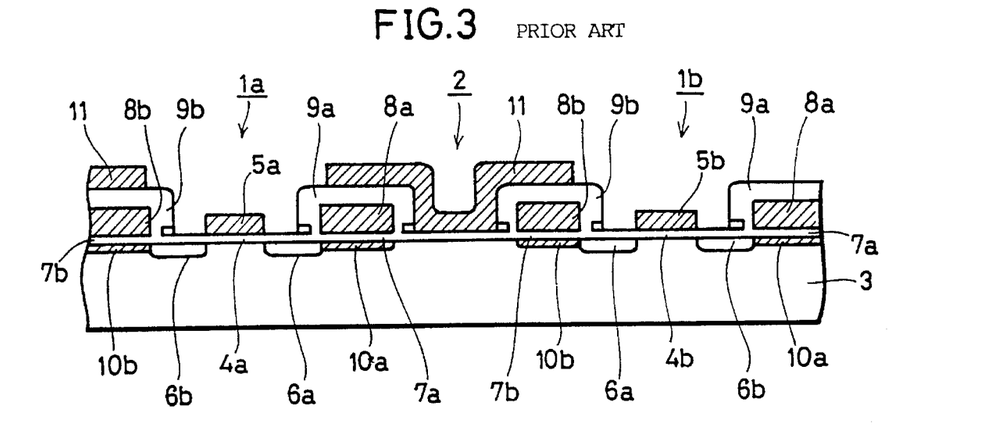
FIG. 3 is a sectional view of a semiconductor device comprising a MOS transistor isolated by a conventional field shield isolating structure.

A semiconductor device comprises an integrated circuit formed of many semiconductor elements on a surface of a semiconductor substrate. Each semiconductor element on the semiconductor substrate is isolated from another semiconductor element by an element isolating region. This element isolating region is an important element for the reliability and a high degree of integration of the semiconductor device. More specifically, to assure the reliability of the semiconductor device, the element isolating region is required to completely function as an insulating and isolating region. In addition, in view of the high degree of integration, it is required to be structured in an area as small as possible. As the element isolating structure, a so-called field shield isolating structure is well-known. The field shield isolating structure is disclosed in, for example Japanese Patent Laying-Open No. 122174/1987. FIG. 3 is a sectional view of an N channel MOS (Metal-Oxide-Semiconductor) field effect transistor comprising the field shield isolating structure disclosed in this gazette. In FIG. 3, two MOS transistors 1a and 1b and one element isolating region 2 are shown. The MOS transistors 1a and 1b comprise gate oxide films 4a and 4b and gate electrodes 5a and 5b formed on the surface of a p type silicon substrate 3, respectively. In addition, each of the MOS transistors 1a and 1b comprises a pair of n$^+$ impurity regions (source and drain) 6a and 6b formed on the surface of the P type silicon substrate 3 in a self-aligning manner to each of the gate electrodes 5a and 5b. Field shield gate oxide films 7a and 7b and field shield electrodes 8a and 8b are formed on the surface of the p type silicon substrate 3 positioned in the element isolating region 2. The peripheral surfaces of the field shield electrodes 8a and 8b are covered with insulating layers 9a and 9b. Channel stop layers 10a and 10b formed of a p$^+$ impurity region are formed on the surface of the p type silicon substrate 3 covered with the field shield electrodes 8a and 8b. In addition, a wiring layer 11 is formed on the surface of the insulating layers 9a and 9b.

A description is given of a structure and operation of the field shield isolating structure. In the structure, as shown in FIG. 3, an MOS transistor (hereinafter referred to as a FS transistor) comprises the wiring layer 11, the field shield gate oxide films 7a and 7b, the field shield electrodes 8a and 8b and the n$^+$ impurity regions 6a and 6a of two transistors 1a and 1b.

When the semiconductor device is operated, a predetermined voltage is applied to the wiring layer 11. Then, the electric field of the wiring layer 11 has an influence on the surface of the p type silicon substrate 3 between the n$^+$ impurity regions 6a and 6a. When an inverted layer is formed on this region, one MOS transistor 1a and the other MOS transistor 1b are rendered to be conductive, so that an element isolating function is destroyed. The electrodes 8a and 8b prevent this inverted layer from forming. More specifically, the field shield electrodes 8a and 8b are held at the same potential as that of the p type silicon substrate 3 or the ground potential. Therefore, they dissipate the influence of the voltage from the wiring layer 11 and prevent the inverted layer from forming on the surface of the p type silicon substrate. In addition, channel stop layers 10a and 10b having a concentration higher than that of the substrate are formed on the surface of the p type silicon substrate 3. The channel stop layers 10a and 10b serve to restrain this region from being inverted to the N type conductive layer by increasing the concentration of the p type impurities. In this way, in the field shield isolating structure, a transistor structure which is always off state is constituted by the field shield gate oxide films 7a and 7b, the field shield electrodes 8a and 8b and one n$^+$ impurity regions 6a and 6a of the MOS transistors 1a and 1b. Therefore, in order to make the element isolating function reliable using the field shield isolating structure, a voltage necessary for the FS transistor constituting the field shield isolating structure to turn on, that is, a condition of threshold voltage $V_{TH}$ should be set high. As shown in FIG. 3, the channel stop layers 10a and 10b are provided on the surface of the p type silicon substrate 3 to set the threshold voltage high.

Referring to FIGS. 4A to 4G, a description is given of a method of manufacturing the MOS transistor device shown in FIG. 3.

Figure 4A:
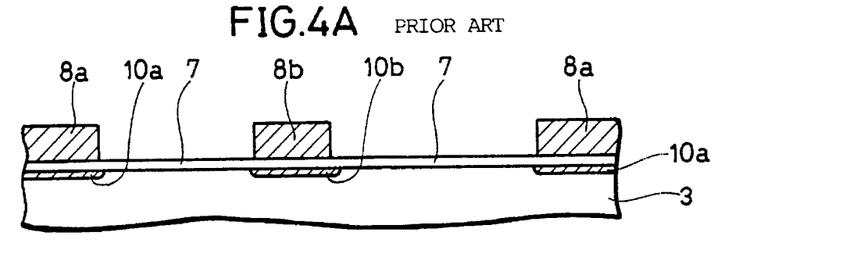
FIGS. 4A to 4G are sectional views of the semiconductor device shown in FIG. 3 showing its manufacturing steps.

First, as shown in FIG. 4A, a thin field insulating film is formed on the main surface of a p type silicon substrate 3. Then, channel stop layers 10a and 10b of a p type impurity region with a high concentration are formed at predetermined regions. Usually, these channel stop layers 10a and 10b are formed by making ion implantation of impurities on the surface of the p type silicon substrate, using a resist pattern formed by a photolithography method as a mask. Next, a polysilicon layer is deposited to be patterned into a predetermined configuration. As a result, field shield electrodes 8a and 8b are formed.

Figure 4B:
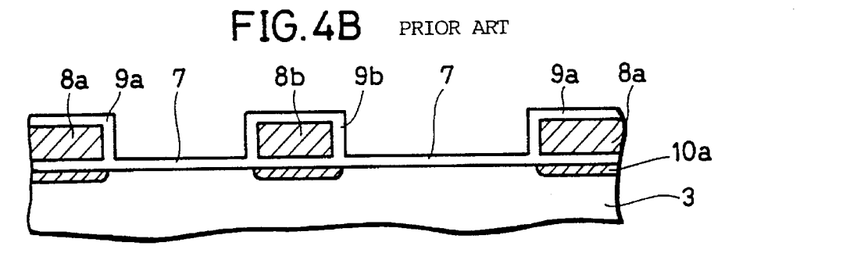

As shown in FIG. 4B, insulating layers 9a and 9b of a silicon oxide film are formed on the surface of the electrodes 8a and 8b comprising polysilicon by heat oxidation treatment.

Figure 4C:
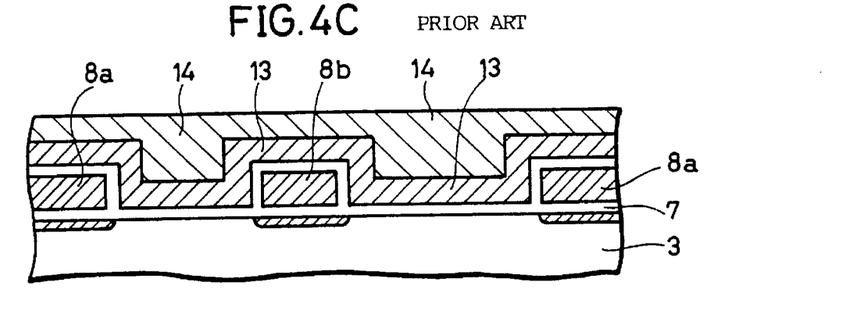

As shown in FIG. 4C, a silicon nitride film 13 is formed on the surface of the field insulating film 7 and the insulating layers 9a and 9b. Then, a resist 14 is applied thereto.

Figure 4D:
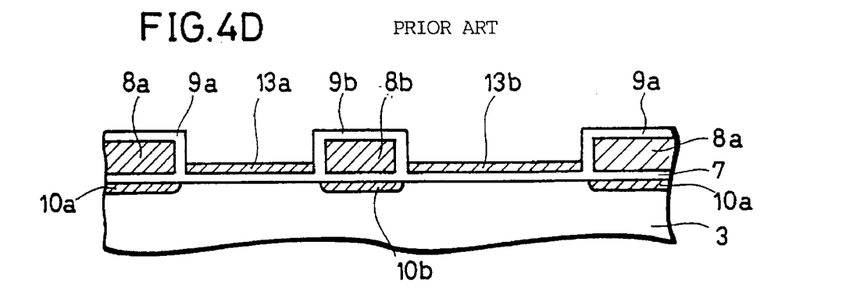

As shown in FIG. 4D, the resist 14 and the silicon oxide film 13 are etched away at the same etching speed. The silicon nitride film 13a is selectively left at the only region sandwiched by the electrodes 8a and 8b.

Figure 4E:
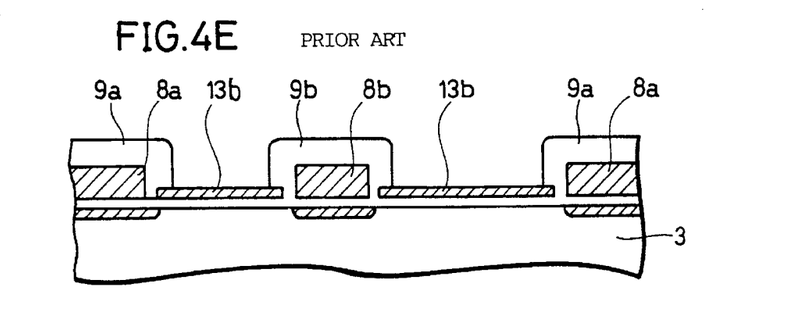

As shown in FIG. 4E, the substrate surface is treated by heat oxidation using the silicon nitride films 13a and 13b as a oxidation-proof mask. As a result, the film thickness of the insulating layers 9a and 9b surrounded by the electrodes 8a and 8b are formed thick.

Figure 4F:
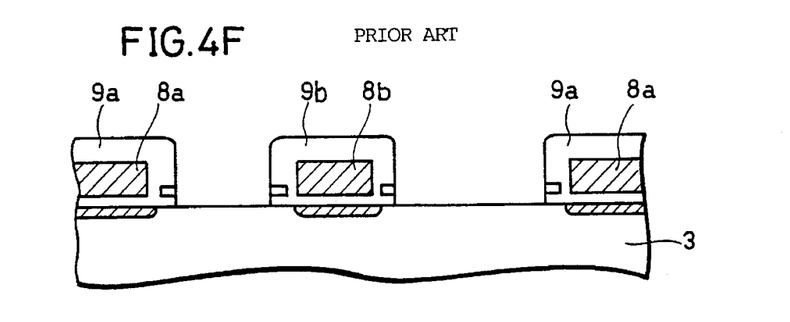

As shown in FIG. 4F, the silicon nitride films 13a and 13b and the field insulating film 7 positioned beneath those films are removed by anisotropic etching. As a result, the field shield gate insulating films 7a and 7b remain only beneath the field shield electrodes 8a and 8b.

Figure 4G:
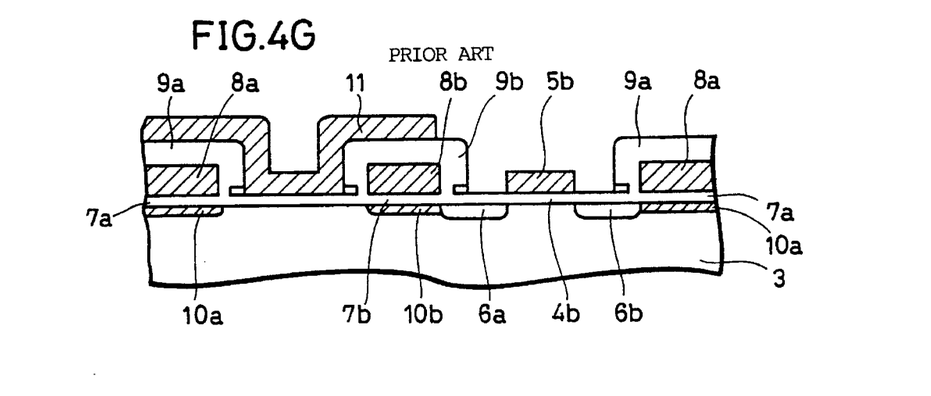

As shown in FIG. 4G, a gate oxide film 4b having the same film thickness as that of the field shield oxide films 7a and 7b is formed on the surface of the p type silicon substrate 3 sandwiched by the electrodes 8a and 8b by heated oxidation treatment. Then, a polysilicon layer is deposited and patterned on the surface of the gate oxide film 4b to form a gate electrode 5b. $N^+$ impurity regions 6a and 6b are formed on the surface of the p type silicon substrate 3 by ion implantation, using the field shield electrodes 8a and 8b covered with the insulating layers 9a and 9b and the gate electrode 5b as masks. Then, a wiring layer 11 is formed on the surface of the p type silicon substrate and the electrodes 8a and 8b through the insulating layer.

As a result, the N channel field effect transistor having the field shield isolating structure is formed.

As described above, the conventional field shield isolating structure has the channel stop layers 10a and 10b in order to increase the threshold voltage of the FS transistor constituting this isolating structure. Meanwhile, the channel stop layers 10a and 10b have a disadvantage that a narrow channel effect is caused together with the miniaturization of the semiconductor device. The narrow channel effect is caused by the fact that the impurities of the channel stop layers 10a and 10b are diffused on the channel regions of the MOS transistors 1a and 1b. This increases an effective impurity concentration of the substrate. As a result, the threshold voltages of the MOS transistors 1a and 1b are increased. More specifically, the impurities of the channel stop layers 10a and 10b are diffused under the influence of heat treatment of several times during the manufacturing processes.

In addition, in the above-described conventional example, it is intended that the film thickness of the field shield gate oxide films 7a and 7b, to be formed thin, is made to be the same as that of the gate oxide films 4a and 4b. In this way, it is intended that radiation resistance is improved. For this reason, the channel stop layers 10a and 10b were considered to be indispensable elements to increase the threshold voltage of the FS transistor for isolating elements. Therefore, it was difficult to prevent the narrow channel effect caused by the channel stop layers 10a and 10b.

SUMMARY OF THE INVENTION

An object of the present invention is to improve insulating and isolating characteristics of a field shield isolating structure.

Another object of the present invention is to improve the controllability of the film thickness of a gate insulating film of the field shield isolating structure.

A further object of the present invention is to make it possible to adjust the offset amount of an offset gate type MOS transistor structure constituting the field shield isolating structure.

Still another object of the present invention is to establish a method of manufacturing the field shield isolating structure in a self-aligning manner.

A further object of the present invention is to provide the field shield structure in which need for the channel stop is eliminated.

The field shield isolating structure comprises a field shield gate insulating film (a second insulating film) capable of setting its film thickness arbitrarily. The film thickness of the field shield gate insulating film defines the threshold voltage of the FS transistor constituting the field shield isolating structure. Therefore, by adjusting the film thickness of the field shield gate insulating film, it becomes possible to constitute the FS transistor for field shield isolation having a predetermined threshold voltage.

The field shield electrode has an insulating layer (third insulating film), whose film thickness can be arbitrarily set, on the upper surface and the side surfaces. When a conductive layer is formed on the insulating layer, the proportion of the film thickness of the insulating layer at a portion on the field shield electrode to the film thickness of the field shield gate insulating film is determined in accordance with a prescribed relation. More specifically, the proportion is defined such that the voltage of the field shield electrode excited by capacitance division of the voltage from the conductive layer becomes smaller than a prescribed value.

According to the manufacturing method in accordance with the present invention, the field shield gate insulating film is manufactured in the process independent of the manufacturing process of the gate oxide film of the MOS transistor formed on the element forming region. As a result, it is possible to form the film thickness of the field shield gate insulating film arbitrarily.

The process of forming the insulating layer on the side and upper surfaces of the field shield electrode is performed using the process of depositing two-layer insulating layer. First, the first insulating film is formed only on the upper surface of the field shield electrode. The second insulating film is formed on the upper and side surfaces of the field shield electrode and then left only on the side surface by anisotropic etching. As a result, the first insulating layer is left on the upper surface of the field shield electrode and a side wall spacer comprising the second insulating layer is left on the side surface. Both film thicknesses can be arbitrarily set. The thickness of the insulating film on the upper surface of the field shield electrode is set so as to have sufficient insulating characteristics for a conductive layer to be formed on this layer. In addition, at the same time, the thickness of the insulating film is set such that the voltage across the field shield electrode may be sufficiently lower than the threshold voltage of the FS transistor when a gate electrode of another MOS transistor is formed on the upper portion of the field shield electrode. The sidewalls spacer is determined so as to define the offset amount of the FS transistor.

By using such manufacturing method, it becomes possible to improve the isolating characteristics of the field shield isolating structure constituted by the FS transistor having an arbitrarily set threshold voltage.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Hereinafter, referring to the figures, a description is given of one embodiment of the present invention.

Figure 1A:
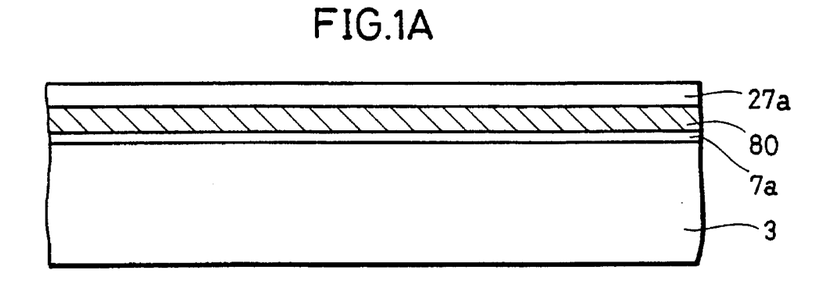
FIGS. 1A to 1L are sectional views of a DRAM memory cell showing/manufacturing processes in order of steps in accordance with one embodiment of the present invention.
Figure 1B:
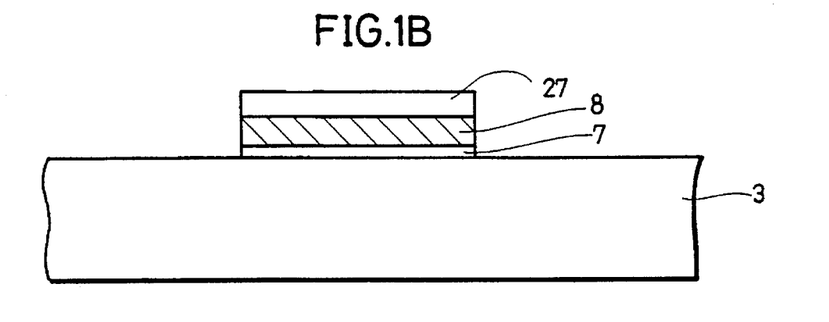
Figure 1C:
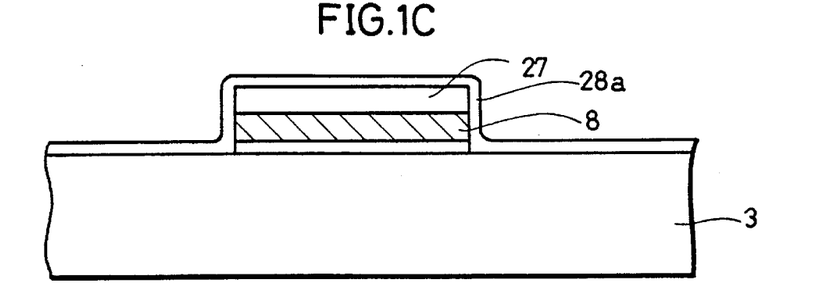
Figure 1D:
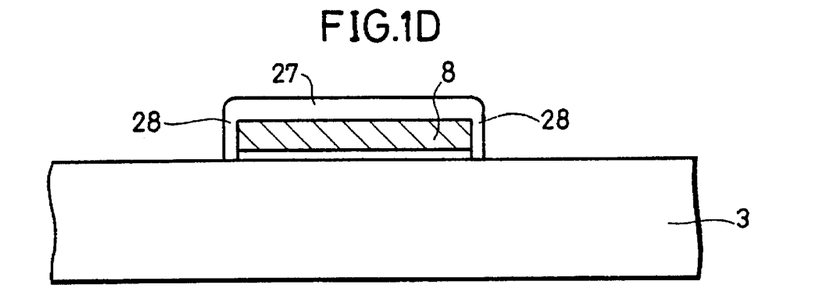
Figure 1E:
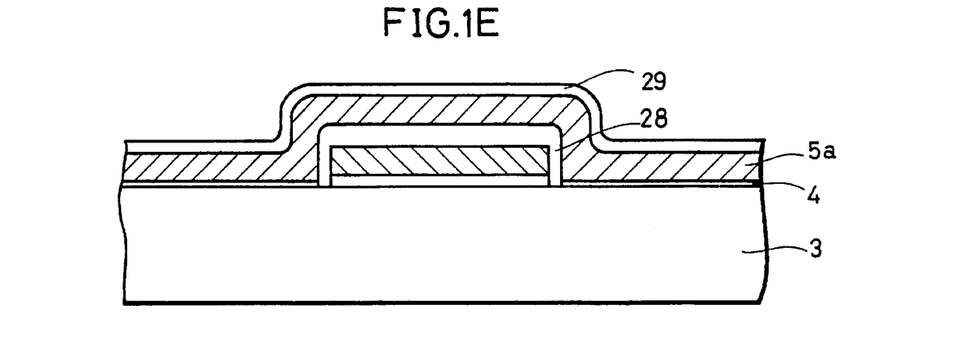
Figure 1F:
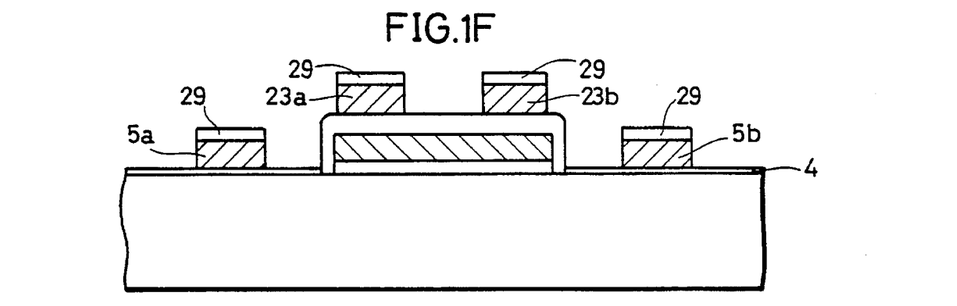
Figure 1G:
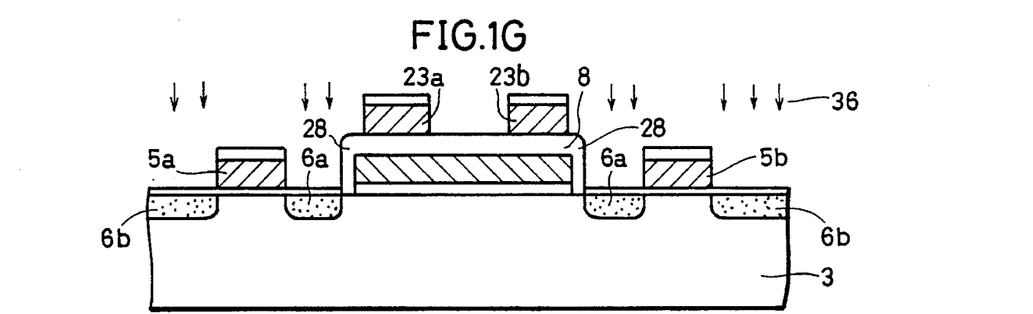
Figure 1H:
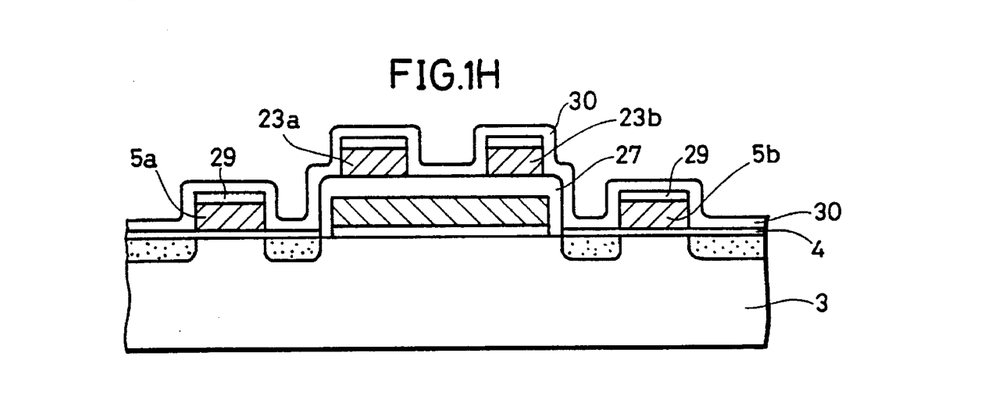
Figure 1I:
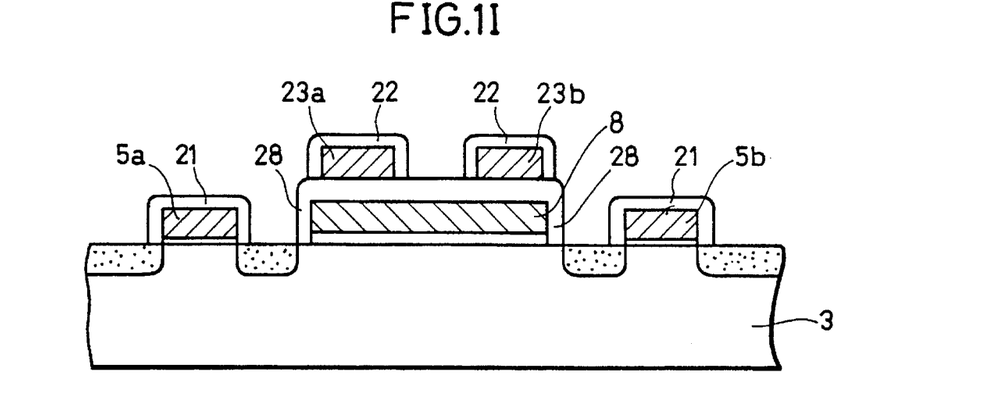
Figure 1J:
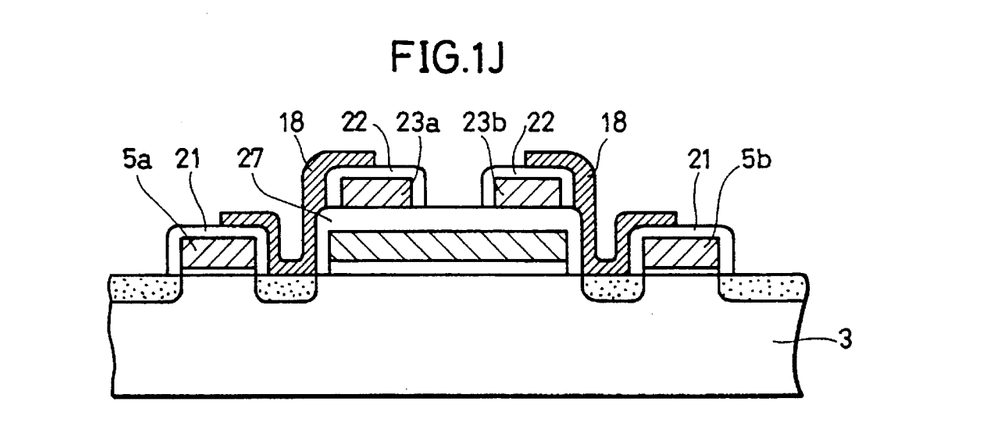
Figure 1K:
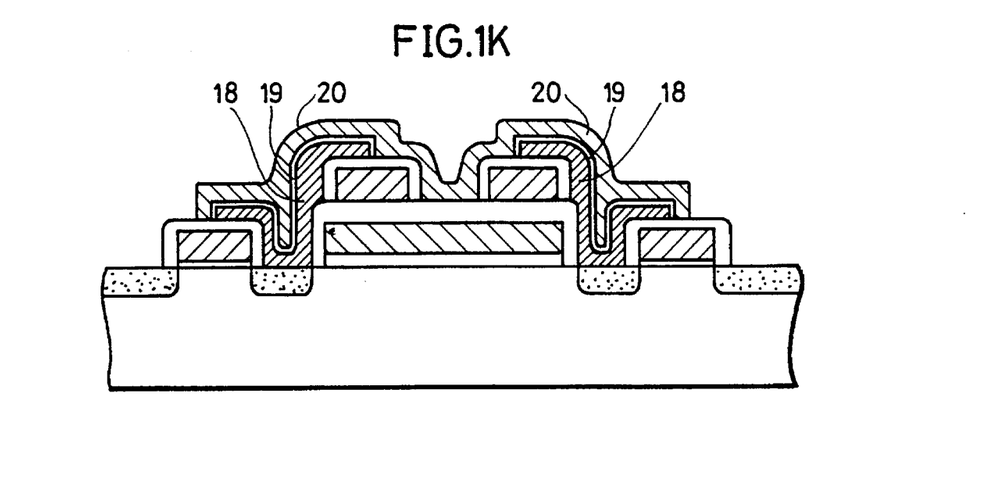
Figure 1L:
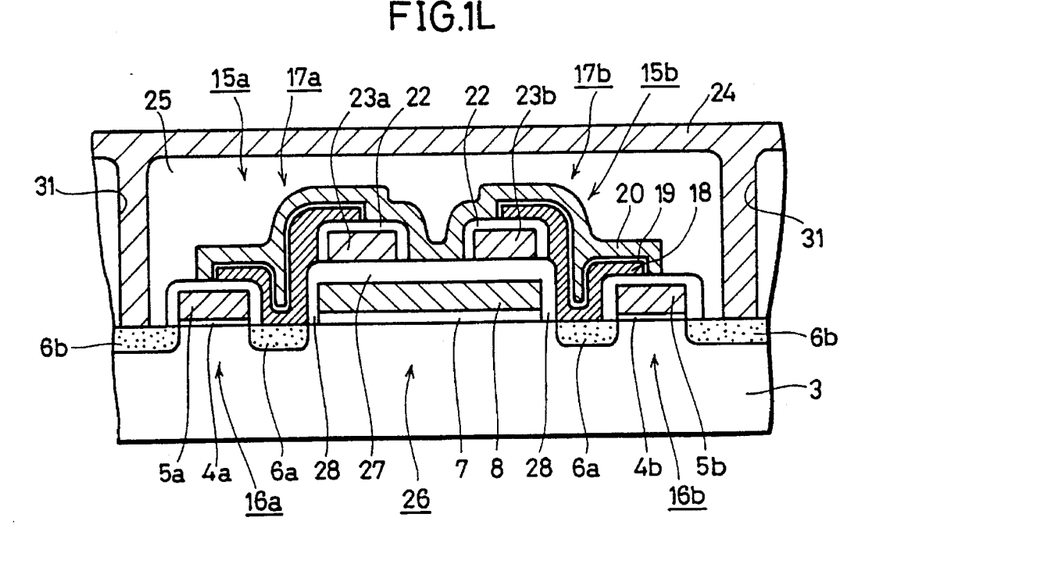

FIG. 1L is a sectional view of a memory cell of a DRAM (Dynamic Random Access Memory) using a field shield isolating structure as an element isolating structure. FIG. 1L shows a 2-bit memory cell. The memory cells 15a and 15b comprises MOS transistors 16a and 16b and capacitors 17a and 17b, respectively. The MOS transistor 16a and 16b comprises pairs of $n^+$ impurity regions 6a and 6b (source and drain) formed spaced apart by a predetermined distance on the surface of the p type silicon substrate 3, gate oxide films 4a and 4b and gate electrodes 5a and 5b formed on the surface of the p type silicon substrate 3.

Each of the capacitors 17a and 17b has a laminated structure comprising a first electrode layer 18 (storage node), a dielectric film 19 and a second electrode layer 20 (cell plate). The first electrode layer 18 has its one end extending onto the gate electrodes 5a and 5b of the MOS transistors 16a and 16b through the insulating film 21 and its other end extending onto the upper portions of word lines 23a and 23b formed on the element isolating region. One portion of the first electrode layer 18 is connected to $n^+$ impurity regions 6a of respective one of the transistors 16a and 16b. The capacitors 17a and 17b having such structure is called a stacked capacitors. The other $n^+$ impurity regions 6b and 6b of the MOS transistors 16a and 16b are connected to a bit line 24. An interlayer insulating film 25 is formed on the surface of the capacitors 17a and 17b.

The memory cell 15a is isolated from the memory cell 15b by a field shield isolating structure 26. The field shield isolating structure 26 is constituted by the FS transistor. The FS transistor comprises a field shield gate oxide film 7, a field shield electrode 8, one $n^+$ impurity region 6a of the MOS transistor 16a of the memory cell 15a, and one $n^+$ impurity region 6a of the MOS transistor 16b of the other memory cell 15b. An upper portion oxide film 27 and sidewall spacers 28 and 28 comprising a silicon oxide film are formed on the upper and side surfaces of the field shield electrode 8.

In the above described structure, main features of the present invention are as follows;

a. The film thickness of the field shield gate oxide film 7 is formed thick as compared with that of the gate oxide films 4a and 4b of the MOS transistors 16a and 16b.

b. One $n^+$ impurity regions 6a and 6a of the MOS transistors 16a and 16b are formed so as to be offset to the field shield electrode 8 by the sidewall spacer 28.

c. The film thickness of the upper portion oxide film 27 positioned on the upper surface of the field shield electrode 8 is different from that of the sidewall spacer 28 positioned on the side surface of the field shield electrode 8.

d. The film thickness of the upper portion oxide film 27 is set such that the voltage induced on the field shield electrode 8 may be sufficiently lower than the threshold voltage of the FS transistor by the voltages of the word lines 23a and 23b formed on the element isolating region.

e. A ground potential, a substrate potential or a floating potential may be applied to the field shield electrode.

By these features, the threshold voltage of the FS transistor can be arbitrarily set. The side surfaces and the upper surface of the field shield electrode 8 are covered with insulating films 28 and 27 having different thicknesses. By such adjustment, it becomes possible to constitute the FS transistor held in the OFF state all the time, whereby isolation between elements can be reliably carried out.

Figure 2:
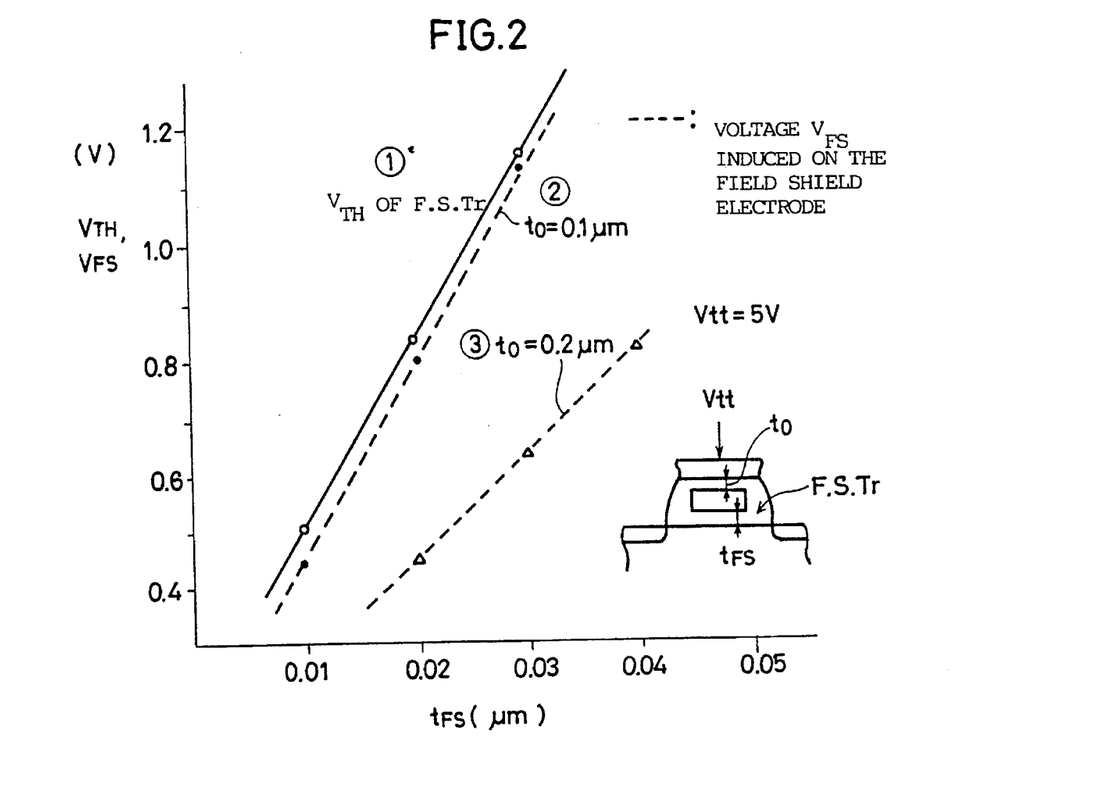
FIG. 2 is a correlation diagram showing the relation between the film thicknesses of a field shield gate of insulating film, an upper portion oxide film in a field shield isolating structure in accordance with the present invention, the threshold voltage of a FS transistor and the voltage across a field shield electrode.

FIG. 2 is a correlation diagram showing the relation between the film thickness $t_{FS}$ of the field shield gate insulating film, the film thickness $t_0$ of the upper portion oxide film of the FS transistor, the threshold voltage $V_{TH}$ of the FS transistor and the voltage $V_{FS}$ across the field shield electrode. A illustration of these parameters is shown in the right corner in FIG. 2. The voltage $V_{FS}$ represents a voltage induced on the field shield electrode of the FS transistor when a predetermined voltage $V_u$ (=5 V) is applied to a wiring layer on the upper portion of the FS transistor.

First, it is found that the threshold voltage $V_{TH}$ of the FS transistor is increased together with the increase in the film thickness of the field shield gate insulating film $t_{FS}$ in reference to a solid line ①.

In addition, referring to dotted lines ② and ③, the voltage $V_{FS}$ induced on the field shield electrode of the FS transistor is decreased together With the increase in the film thickness $t_0$ of the upper portion oxide film to be lower than the threshold voltage $V_{TH}$ of the FS transistor.

As shown in the result in FIG. 2, by setting thick the film thicknesses of the field shield gate insulating film and the upper portion oxide film 27 of the FS transistor, it is possible to control the voltage $V_{FS}$ induced on the field shield electrode of the FS transistor below the threshold voltage $V_{TH}$ of the FS transistor.

Next, a description is given of a manufacturing method of the above-described DRAM memory cell in reference to FIGS. 1A to 1L.

First, as shown in FIG. 1A, a silicon oxide film 7a having a film thickness of 50 nm is formed on the main surface of the p type silicon substrate by a heat oxidation method. Then, a polysilicon layer 80 doped with phosphorus (P) is deposited by 200 nm in thickness on the surface by a LPCVD (Low Pressure Chemical Vapor Deposition) method. Then, a silicon oxide film 27a having a film thickness of 200 nm is deposited by the CVD method on the surface.

Next, as shown in FIG. 1B, the silicon oxide film 27, the polysilicon layer 80 and the silicon oxide film 7a are patterned to be a predetermined configuration by photolithography. In this process, a field gate oxide film 7, a field shield electrode 8 and an upper portion oxide film 27 are formed.

Then, as shown in FIG. 1C, the silicon oxide film 28a is deposited on the surface of the p type silicon substrate 3 and on the surface of the silicon oxide film 27 using the CVD method.

Thereafter, as shown in FIG. 1D, the silicon oxide film 28a is treated by anisotropic etching and a sidewall spacer 28 is formed on the side surface of the field shield electrode 8 by removing the silicon oxide film 27 and the silicon oxide film 28a on the surface of the silicon substrate 3.

As shown in FIG. 1E, a gate oxide film 4 having a film thickness of 20 nm is formed on the surface of the p type silicon substrate by the heat oxidation method. Then, a polysilicon layer 5a having a film thickness of 200 nm is deposited on the surface of the gate oxide film 4, the upper portion oxide film 27 and the sidewall spacer 28 by the LPCVD method. In addition, a silicon oxide film 29 is formed thereon.

As shown in FIG. 1F, the polysilicon layer 5a and the silicon oxide film 29 are selectively removed by photolithography and etching to form gate electrodes 4a and 4b and word lines 23a and 23b.

Then, as shown in FIG. 1G, n type impurity ions 36 are implanted on the surface of the p type silicon substrate 3 using the field shield electrode 8 comprising the patterned gate electrodes 4a and 4b and the sidewall spacer 28 as a mask. As a result, a pair of $n^+$ impurity regions 6a and 6b are formed.

Thereafter, as shown in FIG. 1H, the silicon oxide film 30 is deposited again on the upper surface of the p type silicon substrate 3 by the CVD method.

As shown in FIG. 1I, insulating films 21 and 22 are formed on the side and upper surfaces of the gate electrodes 4a and 4b or on the upper surface of the word lines 23a and 23b by anisotropic etching of the silicon oxide film 30.

Thereafter, as shown in FIG. 1J, a polysilicon layer is deposited and then, patterned to be a predetermined configuration. As a result, first electrode layers 18 and 18 of the capacitor are formed.

As shown in FIG. 1K, a dielectric film 19 of a silicon nitride film and the like is formed on the surface of the first electrode layer 18. A second electrode layer 20 comprising a polysilicon is deposited thereon.

As shown in FIG. 1L, an interlayer insulating film 25 is formed on the surface on which the capacitors 17a and 17b were formed. Then, a contact hole 31 is formed at a predetermined region of the interlayer insulating film 25, then, a bit line 24 connected to one $n^+$ impurity regions 6b and 6b of the MOS transistors 16a and 16b through this contact hole 31 is formed.

As described above, the DRAM memory cell having the field shield isolating structure is manufactured.

In the above described manufacturing process, the film thickness of the field shield gate oxide film 7 is determined by the film thickness of the silicon oxide film 7a formed on the surface of the p type silicon substrate 3. The film thickness of the sidewalls spacer 28 formed on the side surface of the field shield electrode 8 is determined by the film thickness of the silicon oxide film 28a shown in FIG. 1c. In addition, the film thickness of the upper portion oxide film 27 formed on the upper surface of the field shield electrode is determined by the film thickness of the silicon oxide film 27a formed on the upper portion of the polysilicon layer 80 shown in FIG. 1A. The film thicknesses of these layers can be determined in independent manufacturing steps. Therefore, it is possible to set the film thicknesses which are mutually optimum.

The upper portion oxide film 27 and the sidewall spacer 28 formed on the side and upper surfaces of the field shield electrode 8 are deposited by the CVD method. Therefore, it is possible to prevent the decrease of a sectional area of the field shield electrode 8 caused by the heat oxidation method in the prior art. Therefore, it is possible to reliably define the offset length between the field shield electrode 8 and the $n^+$ impurity regions 6a and 6a only by the film thickness of the side wall spacer 28.

Although a description was given of the example in which the field shield isolating structure was applied to the element isolating structure of the DRAM memory cell in the above described embodiment, this element isolating structure can be applied to another semiconductor device.

In addition, although the example of the silicon oxide film is shown as the field shield gate insulating film in the above described embodiment, it is possible to use a multilayer structure of, for example a nitride film or an oxide film and a nitride film.

As described above, the field shield isolating structure used in the semiconductor device in the present invention has the field shield gate insulating film having a film thickness independent of that the gate oxide film of the MOS transistor used in the element forming region. In addition, the sidewall spacer positioned on the side surface of the field shield electrode is structured such that the offset length between the impurity region and the field shield electrode constituting a quasi-MOS transistor may be arbitrarily set. Therefore, it becomes possible to arbitrarily set the threshold voltage of the quasi-MOS transistor constituting the field shield isolating structure, so that a semiconductor device excellent in insulating and isolating characteristics can be implemented. In addition, the manufacturing method in accordance with the present invention can implement the semiconductor device excellent in the insulating and isolating characteristic like the above, by securing independent manufacturing processes of the field shield gate insulating film and the sidewall spacer.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. In an integrated circuit device containing a substrate having a major planar surface and having a plurality of FET semiconductor devices each having a pair of impurity diffusion regions formed in said major surface on opposite sides of a respective channel region and a gate electrode separated from the substrate by a gate oxide having a first thickness in a direction normal to said major planar surface, and a conductor for applying a voltage to at least one of said semiconductor devices, an isolating device comprising:

a first insulating layer on said major planar surface of said substrate and having a lower surface coplanar with said major planar surface in an isolation region between two adjacent impurity diffusion regions, each associated with a different FET semiconductor devices, said first insulating layer having a predetermined thickness in said direction normal to said major planar surface, greater than said first thickness, and having vertical surfaces between each of the FET semiconductor devices adjacent said isolation region, a field shield formed on said insulating layer and spaced apart in a channel direction from each of said two adjacent impurity diffusion regions to prevent parasitic conduction, said field shield being electrically isolated from the substrate, and a further insulating layer disposed between said field shield and said conductor and including an upper layer portion formed on said field shield and side layer portions formed in contact with sidewalls of said field shield, said upper layer portion having a second thickness in said direction normal to said major planar surface, relative to said predetermined thickness, to restrict voltage induced at said field shield by said conductor to a level which prevents formation of a region of inverted conductivity type in said substrate below said field shield, and an entire outer edge of each side layer portion (i) being normal to said major planar surface and (ii) aligned with a respective boundary of an impurity region at said major planar surface of said substrate to prevent parasitic conduction through said substrate.

2. A semiconductor device comprising:

a semiconductor substrate of a first conductivity type;

element forming regions including first and second MOS semiconductor elements, each having a first insulting film formed on a main surface of said semiconductor substrate, a first conductive layer formed on this first insulating film and a pair of impurity regions of a second conductivity type at the main surface of said semiconductor substrate at opposite sides of said conductive layer;

a conductor for applying a voltage to at least one of said MOS semiconductor elements; and an element isolating structure between said element forming regions and comprising a second insulating film formed on said semiconductor substrate and having a film thickness, in a direction normal to said main surface, different from that of said first insulating film, a lower surface of said second insulating film being coplanar with said main surface in an isolation region between said first and second MOS semiconductor elements;

an element isolating electrode formed on said second insulating film, said element isolating electrode being electrically isolated from said semiconductor substrate, and a third insulating film comprising an upper layer portion formed on said element isolating electrode and side layer portions formed in contact with sidewalls of said element isolating electrode, said side layer portions having outer edges predetermined distances from said sidewalls;

the entire outer edge of each side layer portion of said third insulating film (i) being normal to said main surface and (ii) aligned with a respective boundary of an impurity region at said main surface of the substrate to prevent parasitic conduction through said substrate, wherein said second insulating film has a film thickness thicker than that of the first insulating film, and wherein said upper layer portion has a thickness relative to the thickness of the second insulating film to restrict voltage reduced at said element isolating electrode by said conductor to a level which prevents formation of a region of inverted conductivity type in said semiconductor substrate below said element isolating electrode.

3. A semiconductor device according to claims 2, wherein said upper layer portion and said side layer portions have different film thicknesses.

4. A semiconductor device in accordance with claim 2, wherein one of said impurity regions of said first MOS semiconductor element and one of said impurity regions of said second MOS semiconductor element adjacent through said isolating region are formed in a self-aligning manner to the third insulating film positioned on the side walls of said element isolating electrode.

5. A semiconductor device according to claim 2, wherein the surface region of said semiconductor substrate covered with said second insulating film has the same conductivity type as said semiconductor substrate and approximately the same concentration as an adjacent channel region of said first and second semiconductor elements.

6. The isolating device of claim 1, wherein the thickness of said first insulating layer is different from the thickness of said further insulating layer.

7. The isolating device of claim 1, wherein said second thickness is different from a thickness of said side layer portion in a direction parallel to said major planar surface.

8. The device of claim 1 wherein said field shield comprises a floating electrode.

9. The device of claim 1 wherein a ground potential is applied to said field shield.

10. The device of claim 1 wherein a potential of said substrate is applied to said field shield.

* * * * *